(12) United States Patent
Khan

(10) Patent No.: US 8,533,550 B2
(45) Date of Patent: Sep. 10, 2013

(54) METHOD AND SYSTEM TO IMPROVE THE PERFORMANCE AND/OR RELIABILITY OF A SOLID-STATE DRIVE

(75) Inventor: Jawad B. Khan, Cornelius, OR (US)

(73) Assignee: Intel Corporation, Santa Clara, CA (US)

( * ) Notice: Subject to any disclaimer, the term of this patent is extended or adjusted under 35 U.S.C. 154(b) by 517 days.

(21) Appl. No.: 12/825,858

(22) Filed: Jun. 29, 2010

(65) Prior Publication Data

US 2011/0320915 A1    Dec. 29, 2011

(51) Int. Cl.
| | |
|---|---|
| *H03M 13/00* | (2006.01) |
| *G11C 29/00* | (2006.01) |
| *H04J 7/00* | (2006.01) |
| *G10L 19/00* | (2013.01) |
| *H04N 7/14* | (2006.01) |
| *H04N 5/445* | (2011.01) |

(52) U.S. Cl.
USPC ........... 714/746; 714/753; 714/760; 714/763; 714/773; 714/774; 370/202; 704/500; 704/501; 348/14.13; 348/568

(58) Field of Classification Search
USPC ................. 714/746, 753, 760, 763, 773, 774; 370/202; 704/500, 501; 348/14.13, 568
See application file for complete search history.

(56) References Cited

U.S. PATENT DOCUMENTS

| | | | | |
|---|---|---|---|---|
| 4,546,342 | A * | 10/1985 | Weaver et al. | 341/51 |
| 5,001,418 | A * | 3/1991 | Posse et al. | 324/73.1 |
| 6,324,621 | B2 * | 11/2001 | Singh et al. | 711/129 |
| 6,583,887 | B1 * | 6/2003 | Clouthier et al. | 358/1.15 |
| 6,961,890 | B2 * | 11/2005 | Smith | 714/763 |
| 7,127,443 | B2 * | 10/2006 | Gueguen et al. | 714/758 |
| 7,188,227 | B2 * | 3/2007 | Luick | 711/172 |
| 7,243,191 | B2 | 7/2007 | Ying et al. | |
| 7,346,517 | B2 * | 3/2008 | Ferris et al. | 704/501 |
| 7,451,237 | B2 * | 11/2008 | Takekawa et al. | 709/247 |

(Continued)

FOREIGN PATENT DOCUMENTS

JP    2006262288 A  *  9/2006

OTHER PUBLICATIONS

International Search Report and Written Opinion for International Application No. PCT/US2011/042222, Feb. 20, 2012, 8 pp. [77.252PCT (ISR & WO)].

(Continued)

*Primary Examiner* — John J Tabone, Jr.
(74) *Attorney, Agent, or Firm* — Konrad Raynes Davda & Victor LLP; David W. Victor

(57) ABSTRACT

A method and system to improve the performance and/or reliability of a solid-state drive (SSD). In one embodiment of the invention, the SSD has logic compress a block of data to be stored in the SSD. If it is not possible to compress the block of data below the threshold, the SSD stores the block of data without any compression. If it is possible to compress the block of data below the threshold, the SSD compresses the block of data and stores the compressed data in the SSD. In one embodiment of the invention, the SSD has logic to dynamically adjust or select the strength of the error correcting code of the data that is stored in the SSD. In another embodiment of the invention, the SSD has logic to provide intra-page XOR protection of the data in the page.

17 Claims, 6 Drawing Sheets

(56) References Cited

U.S. PATENT DOCUMENTS

| | | | | |
|---|---|---|---|---|
| 7,559,004 | B1* | 7/2009 | Chang et al. | 714/758 |
| 7,688,835 | B2* | 3/2010 | Kotzin et al. | 370/401 |
| 7,856,149 | B2* | 12/2010 | Govindaswamy et al. | 382/239 |
| 7,886,034 | B1* | 2/2011 | Hartmann et al. | 709/223 |
| 7,920,700 | B2* | 4/2011 | Pandey et al. | 380/37 |
| 8,300,563 | B2* | 10/2012 | Krishnaswamy et al. | 370/310 |
| 2007/0291571 | A1* | 12/2007 | Balasundaram | 365/227 |
| 2008/0098083 | A1* | 4/2008 | Shergill et al. | 709/217 |
| 2008/0144079 | A1* | 6/2008 | Pandey et al. | 358/1.15 |
| 2009/0190607 | A1* | 7/2009 | Pozhenko et al. | 370/450 |
| 2010/0281340 | A1* | 11/2010 | Franceschini et al. | 714/763 |
| 2011/0039506 | A1* | 2/2011 | Lindahl et al. | 455/130 |
| 2011/0080887 | A1* | 4/2011 | Krishnaswamy et al. | 370/329 |
| 2011/0252289 | A1* | 10/2011 | Patapoutian et al. | 714/763 |
| 2011/0307758 | A1* | 12/2011 | Fillingim | 714/758 |
| 2011/0314354 | A1* | 12/2011 | Fillingim | 714/760 |

OTHER PUBLICATIONS

Zhang, W. and T. Li, "Exploring Phase Change Memory and 3D Die-Stacking for Power/Thermal Friendly, Fast and Durable Memory Architectures", In Proceedings of 2009 18th International Conference on Parallel Architectures and Compilation Techniques, Sep. 2009, 12 pp.

* cited by examiner

METHOD AND SYSTEM TO IMPROVE THE PERFORMANCE AND/OR RELIABILITY OF A SOLID-STATE DRIVE

FIELD OF THE INVENTION

This invention relates to a solid-state drive, and more specifically but not exclusively, to a method and system to improve the performance and/or reliability of the solid-state drive.

BACKGROUND DESCRIPTION

Error protection mechanisms are often used to ensure the integrity of the data stored in a solid-state drive. FIG. 1A illustrates a block diagram 100 of data stored in a prior art NAND flash memory page 110. The prior art NAND flash memory page 110 has sector 0 112, sector 1 114, sector 2 116, and sector 3 118 that are protected by the Error Correcting Code 0 (ECC 0) check bytes 120. Similarly, the ECC 1 check bytes 130 protects the sector 4 122, sector 5 124, sector 6 126, and sector 7 128 of the prior art NAND flash memory page 110.

Depending on the severity of the errors in each sector, the ECC 0 check bytes 120 and ECC 1 check bytes 130 can facilitate the detection of errors in the sectors and allow data recovery of the error(s) in the sectors. FIG. 1B illustrates a block diagram 150 of the data stored in a prior art NAND flash memory page 160. The prior art NAND flash memory page 160 has the sector 0 162, sector 1 164, sector 2 166, and sector 3 168 that are protected by the ECC check bytes 170. FIG. 1C illustrates a block diagram 180 of the code words stored in a prior art NAND flash memory page 190. The prior art NAND flash memory page 190 has four code words (CW) 1-4 192, 194, 196, and 198 that are protected by the ECC 0-3 check bytes 193, 195, 197, and 199 respectively.

BRIEF DESCRIPTION OF THE DRAWINGS

The features and advantages of embodiments of the invention will become apparent from the following detailed description of the subject matter in which.

DETAILED DESCRIPTION

Figure 1A:
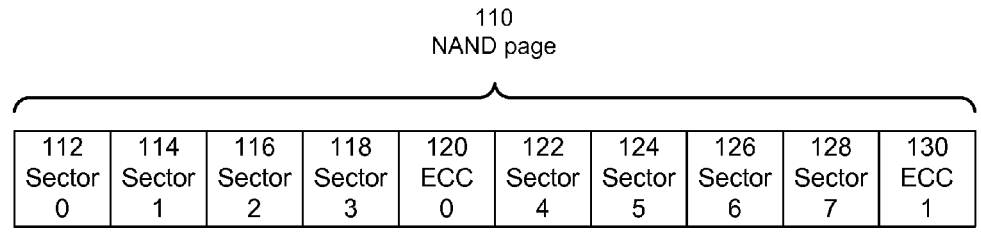
FIG. 1A illustrates a block diagram of data stored in a prior art NAND flash memory page.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

An Error Correcting or Correction code (ECC) allows data that is being read or transmitted to be checked for errors and corrected when needed. The ECC check bytes are a sequence of bits that are calculated based on an ECC algorithm that allows the detection and correction of the data. A code word refers to a combination of payload data and ECC check bytes in one embodiment of the invention. A data chunk of data is a block or partition of data that is read or written for each operation.

Embodiments of the invention provide a method and system to improve the performance and/or reliability of a solid-state drive (SSD). In one embodiment of the invention, the SSD has logic to compress a block of data that is to be stored in the SSD and determine whether the block of data to be stored in the SSD is compressed below a threshold. If it is not possible to compress the block of data below the threshold, the SSD stores the block of data without any compression. If it is possible to compress the block of data below the threshold, the SSD stores the compressed data in the SSD.

The performance of the SSD is linked to the amount of excess memory that is reserved for managing the SSD and the extra space gained by compressing the block of data is used to improve the performance of the SSD in one embodiment of the invention. In one embodiment of the invention, the amount of excess memory and/or the extra space gained by compressing the block of data is not reported and is not available to a user of the SSD. In one embodiment of the invention, the SSD uses, but is not limited to, NAND flash memory modules and any other form of memory storage medium. In one embodiment of the invention, the SSD is compliant at least in part with an Open NAND Flash Interface (ONFI) protocol.

In one embodiment of the invention, the SSD has logic to dynamically adjust or select the strength of the error correcting code (ECC) of the data that is stored in the SSD. The SSD dynamically adjusts the strength of the ECC of the data by compressing the data and appending or adding a known data pad in one embodiment of the invention. The ECC of the compressed data and the known data pad is determined or calculated and the ECC check bytes are stored in addition to the compressed data and the known data pad. The known data pad has a sequence of data or information that is pre-set or pre-determined to facilitate the recovery of the errors in the compressed data.

In another embodiment of the invention, the data is partitioned or divided into a number of code words or data chunks. In one embodiment of the invention, the SSD selects one of the code words and performs an exclusive OR (XOR) operation on all the code words except the selected code word to obtain a XOR code word. The SSD replaces the selected code word with the XOR code word. In one embodiment of the invention, the SSD stores the XOR code word and the other code words in a single memory page. This allows an intra-page recovery to be performed if there is an error in any one of the code words in the single memory page.

Figure 2:
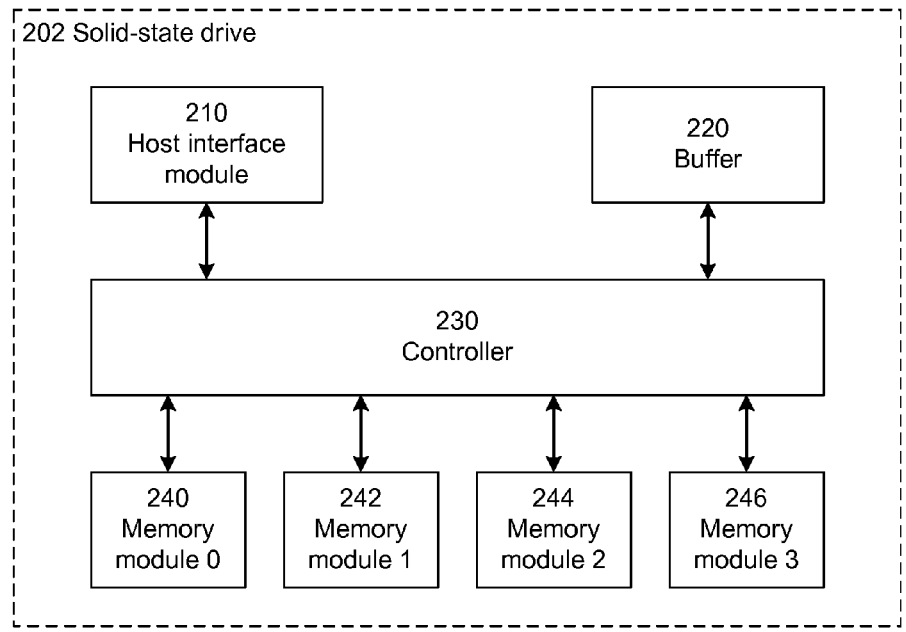
FIG. 2 illustrates a block diagram of a solid-state drive in accordance with one embodiment of the invention.

FIG. 2 illustrates a block diagram 200 of a SSD 202 in accordance with one embodiment of the invention. The SSD 102 has a controller 230 that is coupled with a host interface module 210, a buffer 220, memory module 0 240, memory module 1 242, memory module 2 244, and memory module 3 246.

In one embodiment of the invention, the host interface module 210 provides an interface to connect with a host device or system. The host interface module 210 operates in accordance with a communication protocol, including but not limited to, Serial Advanced Technology Attachment (SATA) Revision 1.x, SATA Revision 2.x, SATA Revision 3.x, and any other type of communication protocol.

The buffer 220 provides temporary storage to the SSD 202 in one embodiment of the invention. The buffer 220 includes, but is not limited to, Synchronous Dynamic Random Access Memory (SDRAM), Dynamic Random Access Memory (DRAM), RAMBUS Dynamic Random Access Memory (RDRAM), Static RAM (SRAM), and/or any other type of random access memory device. In one embodiment of the invention, the buffer 220 is integrated within the controller 230.

The controller 230 has logic to dynamically adjust or select the strength of the error correcting code (ECC) of the data that is stored in the memory modules 0-3 240, 242, 244, and 246 in one embodiment of the invention. The controller 230 also has logic to compress a block of data to be stored in the memory modules 0-3 240, 242, 244, and 246 and determine whether the block of data to be stored in the memory modules 0-3 240, 242, 244, and 246 is compressed below a threshold in one embodiment of the invention.

In one embodiment of the invention, the memory modules 0-3 240, 242, 244, and 246 include, but are not limited to, NAND flash memories and the like. The number of memory modules shown in FIG. 2 is not meant to be limiting and in other embodiments of the invention, there can be more or less than four memory modules. In one embodiment of the invention, the controller 230, the host interface module 210 and the buffer 220 are integrated into a single integrated circuit (ASIC).

Figure 3A:
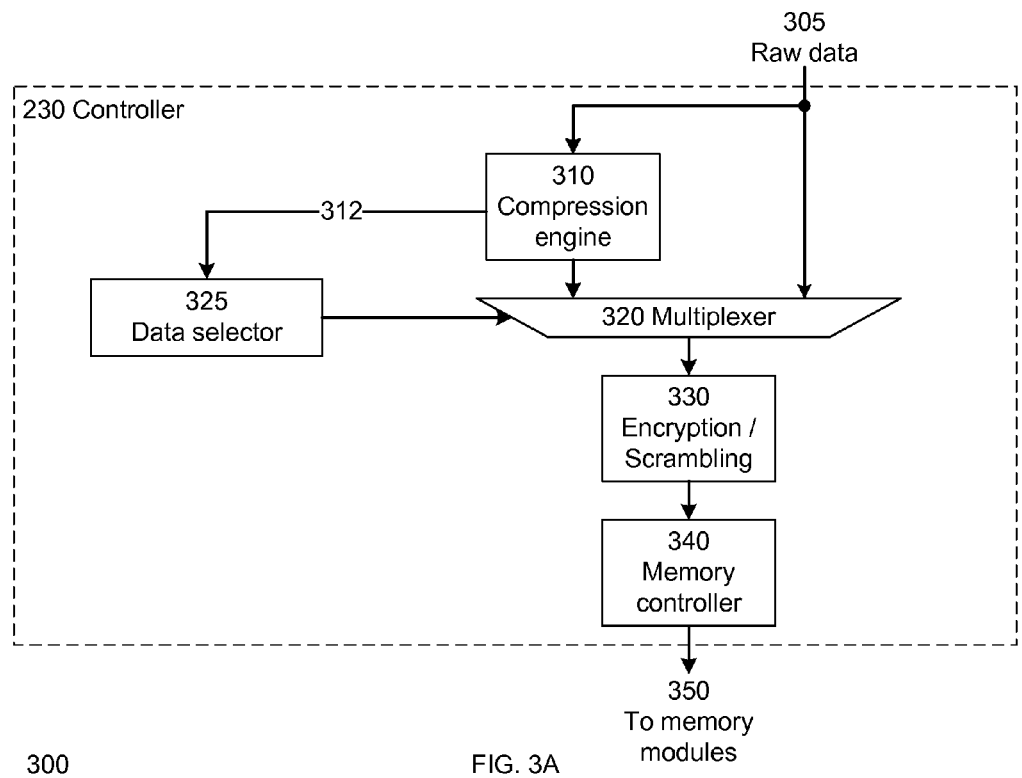
FIG. 3A illustrates a block diagram of a controller in accordance with one embodiment of the invention.

FIG. 3A illustrates a block diagram 300 of a controller 230 in accordance with one embodiment of the invention. For clarity of illustration, FIG. 3A is discussed with reference to FIG. 2. In one embodiment of the invention, the controller 230 has a multixpler 320 that has an input from the raw data 305 and an input from the compression engine 310. The data selector 325 provides the selection signal between the raw data 305 and the compression engine 310 to the multiplexer 320. The output of the multiplexer 320 is coupled with an encryption/scrambling module 330 and the output of the encryption/scrambling module 330 is coupled with a memory controller 340. The memory controller is coupled with the memory modules 0-3 240, 242, 244, and 246 in one embodiment of the invention.

In one embodiment of the invention, the compression engine 310 is capable of compressing the raw data 305 that comes from the host interface module 210 and/or the buffer 220. As the raw data 305 arrives, the compression engine 310 compresses each block of raw data 305. When a block of raw data 305 is determined to be compressible below a particular threshold, the compression engine 310 informs the data selector 325 to send a signal to the multiplexer 320 to select the input from the compression engine 310 to receive the compressed block of raw data 305 that is determined to be compressible below the particular threshold.

When a block of raw data 305 is determined not to be compressible below the particular threshold, the compression engine 310 informs the data selector 325 to send a signal to the multiplexer 320 to select the input from the raw data 305. The controller 230 allows the raw data 305 to be stored in compressed form or format only when the amount of achievable compression exceeds the threshold in one embodiment of the invention.

The size of the block of raw data 305 is set at, but is not limited to, 512 bytes, 1 kilobytes, and any other appropriate size suitable for compression. The threshold is set at, but is not limited to, a size of the compressed block of data, a compression ratio of a size of the block of data to a size of the compressed block of data, and any other suitable indicator of the compression. In one embodiment of the invention, the data selector 325 and the compression engine 310 are combined together into a single module. The compression engine 310 is a hardware based compression engine that uses a lossless data compression algorithm in one embodiment of the invention. This allows the original data from the raw data 305 to be reconstructed from the compressed data during the decompression phase. The lossless data compression algorithm includes, but is not limited to, the Lempel-Ziv (LZ) class of lossless data compression algorithms including but not limited to LZ77, LZ78, LZSS, LZW and their variants, and any other suitable universal lossless data compression algorithms now known or discovered in future.

The encryption/scrambling module 330 encrypts and/or scrambles the output from the multiplexer 320 and sends the encrypted and/or scrambled output to the memory controller 340. In one embodiment of the invention, the memory controller 340 writes the encrypted and/or scrambled output to the memory modules 0-3 240, 242, 244, and 246. In another embodiment of the invention, the memory controller 340 can optionally group the compressed blocks of raw data and write to the memory modules 0-3 240, 242, 244, and 246 as a contiguous memory page. The size of the memory page is set at, but is not limited to, 4 kilobytes or any other suitable size. In another embodiment of the invention, the memory controller 340 writes the compressed blocks of raw data back to the buffer 220 and then issues a write command or operation to write the compressed blocks of raw data from the buffer 220 to the memory modules 0-3 240, 242, 244, and 246 directly.

In one embodiment of the invention, the memory controller 340 keeps track of the compression status of each block of data written to the memory modules 0-3 240, 242, 244, and 246. The memory controller 340 keeps track of the compression status of a particular block of data by setting a token associated with that particular block of data to indicate whether that particular block of data has been compressed. The token includes but is not limited to one or more bits. In one embodiment of the invention, the token has 32 bits that are used to determine whether a particular block of data is compressed or not.

For example, in one embodiment of the invention, the memory controller 340 writes a bit in a token for each block of data written to the memory modules 0-3 240, 242, 244, and 246. The bit in the token associated with any block of data is set to logic one if the block of data has been compressed and is set to logic zero if the block of data has not been compressed. One of ordinary skill in the relevant will readily appreciate that other methods of tracking the compression status of the blocks of data can be used without affecting the workings of the invention.

Figure 3B:
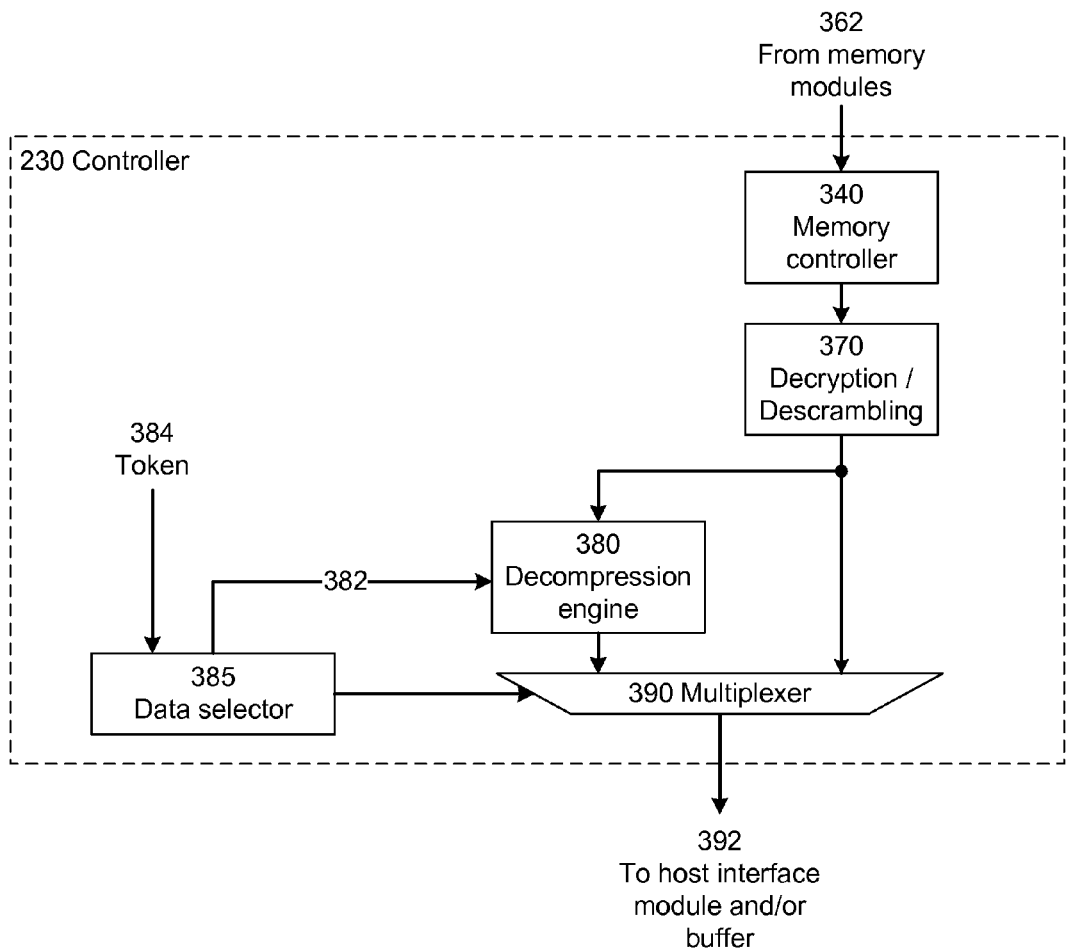
FIG. 3B illustrates a block diagram of a controller in accordance with one embodiment of the invention.

FIG. 3B illustrates a block diagram 360 of a controller 230 in accordance with one embodiment of the invention. For clarity of illustration, FIG. 3B is discussed with reference to FIGS. 2 and 3A. In one embodiment of the invention, the controller 230 has a memory controller 340 that receives data from the memory modules 0-3 240, 242, 244, and 246. The memory controller 340 sends the received data to a decryption/descrambling module 370.

The decryption/descrambling module 370 decrypts and/or descrambles the received data from the memory controller 340 and sends the decrypted and/or descrambled data to the decompression engine 380 and the multiplexer 390. The decompression engine 380 uses the same lossless data decompression algorithm as the compression engine 310 in one embodiment of the invention.

The data selector 385 reads the token 384 associated with the received data to determine whether the received data has been compressed. If the token associated with the received data indicates that the received data has been compressed, the data selector 385 sends a signal to the decompression engine 380 to decompress the received data and sends a signal to multiplexer 390 to select the output from the decompression engine 380 as the data to be sent to the host interface module 210 and/or buffer 220.

If the token 384 associated with the received data indicates that the received data has not been compressed, the data selector 385 does not send a signal to the decompression engine 380 to decompress the received data and sends a signal to multiplexer 390 to select the output from the decryption/descrambling module 370 as the data to be sent to the host interface module 210 and/or buffer 220. In one embodiment of the invention, the data selector 385 and the multiplexer 390 are integrated within the decompression engine 380. The configuration of the controller 230 illustrated in FIGS. 3A and 3B is not meant to be limiting and other variation of the configuration of the controller 230 can be done without affecting the workings of the invention.

Figure 4:
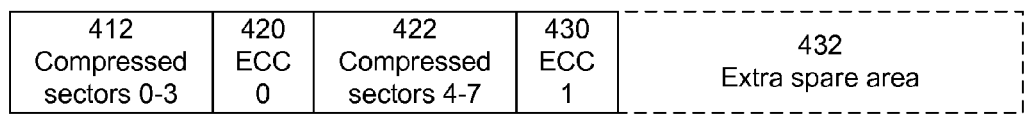
FIG. 4 illustrates a block diagram of compressed data stored in a NAND flash memory in accordance with one embodiment of the invention.

FIG. 4 illustrates a block diagram 400 of compressed data stored in a NAND flash memory in accordance with one embodiment of the invention. For clarity of illustration, FIG. 4 is discussed with reference to FIGS. 1A and 3A. In one embodiment of the invention, the controller 230 receives the sectors 0-7 112, 114, 116, 118, 122, 124, 126, and 128 as the raw data 305 from a host that are to be stored in the memory modules 0-3 240, 242, 244, and 246. In one embodiment of the invention, the compression engine 310 reads four data sectors as a single block of data, i.e., the sectors 0-3 112, 114, 116, and 118 are read as a single block of data and the sectors 4-7 122, 124, 126, and 128 are read as another single block of data.

The compression engine 310 compresses the block of data made up of the sectors 0-3 112, 114, 116, and 118 and determines whether the block of data is compressed below a threshold. Assuming that the block of data made up of the sectors 0-3 112, 114, 116, and 118 is compressed below the threshold, the data selector 325 sends a signal to the multiplexer 320 to select the compressed sectors 0-3 112, 114, 116, and 118 as the input to the multiplexer 320.

The compressed sectors 0-3 112, 114, 116, and 118 are encrypted and/or scrambled by the encryption/scrambling module 330 if needed and the memory controller 340 writes the compressed sectors 0-3 112, 114, 116, and 118 to a NAND flash memory as the compressed sectors 0-3 412 in one embodiment of the invention. The memory controller 340 uses an ECC algorithm to calculate the ECC check bytes of the compressed sectors 0-3 412 and writes the calculated ECC check bytes as the ECC 0 check bytes 420 in the NAND flash memory. The ECC algorithm includes, but is not limited to, a Hamming algorithm, a Reed-Solomon algorithm, a Bose-Chaudhuri-Hocquenghem (BCH) algorithm, Low density parity check (LDPC) codes and the like.

The compressed sectors 4-7 422 and the ECC 1 check bytes 430 are generated in a similar manner as the compressed sectors 0-3 412 and the ECC 0 check bytes 420 and shall not be described herein. One of ordinary skill in the relevant art will readily appreciate how the compressed sectors 4-7 422 and the ECC 1 check bytes 430 are generated.

By compressing the sectors 0-3 112, 114, 116, and 118 and the sectors 4-7 122, 124, 126, and 128, less memory space is required and the extra spare area 432 illustrates the memory area that is saved in the NAND flash memory. In one embodiment of the invention, the extra spare area 432 can be used to increase the performance of the SSD 202. The performance of the SSD 202 is increased as it requires less power to write the compressed sectors 0-3 412 and sectors 4-7 422 and the memory bandwidth of the SSD 202 is increased in one embodiment of the invention. In addition, the performance of the SSD 202 is increased as the write amplification of the SSD 202, i.e., the extra write operations to write a block of data, is reduced as lesser memory area is required to store the compressed sectors 0-3 412 and sectors 4-7 422. In addition, the performance of the SSD 202 is also increased because a larger shuffle area becomes available and the SSD 202 does not have to move data around to create shuffle area in order to be able to continue writing to the memory modules 0-3 240, 242, 244, and 246.

Figure 5:
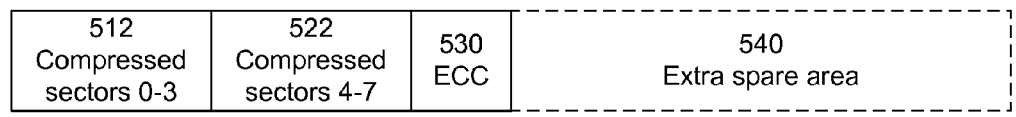
FIG. 5 illustrates a block diagram of compressed data stored in a NAND flash memory in accordance with one embodiment of the invention.

FIG. 5 illustrates a block diagram 500 of compressed data stored in a NAND flash memory in accordance with one embodiment of the invention. In one embodiment of the invention, the memory controller 340 uses an ECC algorithm to calculate the ECC check bytes of both compressed sectors 0-3 512 and sectors 4-7 522 and writes the calculated ECC check bytes as the ECC check bytes 530 in the NAND flash memory. The extra spare area 540 illustrates the memory area that is saved in the NAND flash memory. In one embodiment of the invention, the memory controller 340 writes other compressed or uncompressed sectors in the extra spare area 540.

Figure 1B:
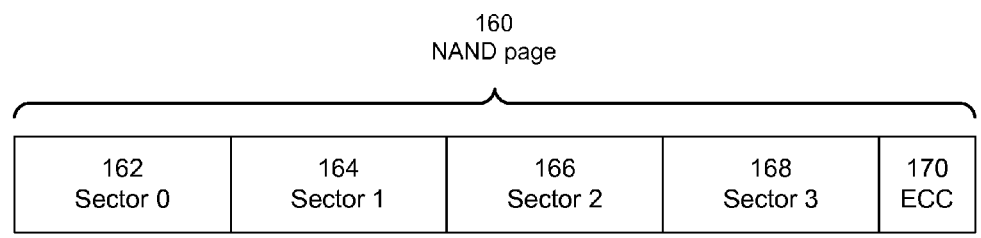
FIG. 1B illustrates a block diagram of data stored in a prior art NAND flash memory page.
Figure 6:
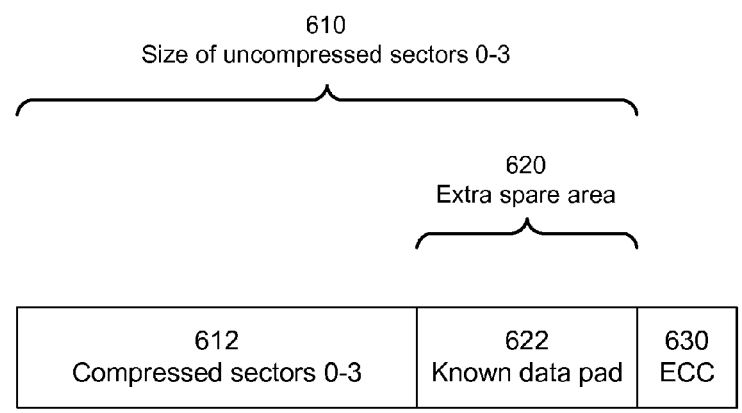
FIG. 6 illustrates a block diagram of a compressed sector and a known data pad in accordance with one embodiment of the invention.

FIG. 6 illustrates a block diagram 600 of the compressed sectors 0-3 612 and a known data pad 622 in accordance with one embodiment of the invention. For clarity of illustration, FIG. 6 is discussed with reference to FIGS. 1B and 3A. The sectors 0-3 162, 164, 166, and 168 of the prior art NAND flash memory page 160 are compressed and stored as the compressed sectors 0-3 612 in one embodiment of the invention. The size of the uncompressed sectors 0-3 610 illustrates the size required to store the sectors 0-3 162, 164, 166, and 168 of the prior art NAND flash memory page 160.

When the sectors 0-3 162, 164, 166, and 168 of the prior art NAND flash memory page 160 are compressed, it creates an extra spare area 620. In one embodiment of the invention, the extra space area 620 is filled with a known data pad 622. For example, in one embodiment of the invention, the known data pad 622 has a repeating sequence or pattern of information and/or data. In one embodiment of the invention, the known data pad 622 is a repeating sequence of 1011*b*. One of ordinary skill in the relevant art will readily appreciate that other sequences of data can be used as the known data pad without affecting the workings of the invention.

The memory controller 340 calculates the ECC of the compressed sectors 0-3 612 and the known data pad 622 and adds the calculated ECC check bytes as the ECC check bytes 630. By appending or adding the known data pad 622 to the compressed sectors 0-3 612, the strength of the ECC check bytes 630 is more than the strength of the ECC 0 check bytes 170 of the prior art NAND flash memory page 160 in one embodiment of the invention. This is because the ECC check bytes 630 are effectively protecting a smaller payload size of the compressed sectors 0-3 612 and the known data pad 622 allows errors to be fixed by inspection and therefore, the ECC check bytes 630 are strengthened.

In one embodiment of the invention, the SSD 202 dynamically adjusts or selects the strength of the error correcting code (ECC) of the data that is stored in the memory modules 0-3 240, 242, 244, and 246 by adjusting the size of the known data pad 622. The size of the known data pad 622 is variable and depends on the compression ratio of the sectors 0-3 162, 164, 166, and 168 achieved. In one embodiment of the invention, the SSD 202 dynamically adjusts the strength of the ECC of the block of data based on the bit error rate (BER) associated with a location in a memory module that is to store the block of data. The location in the memory module includes, but is not limited to, word lines in the memory module and any other form of memory allocation or distribution in the memory module.

For example, in one embodiment of the invention, the BER associated with the word line may be increasing with the order of the word line of the memory module, i.e, a higher order word line may have a worst BER than a lower order word line. In one embodiment of the invention, the SSD 202 actively matches the ECC strength of any data or code word based on the BER characteristics of any memory location where the data or code word is to be stored. In one embodiment of the invention, the SSD 202 uses a stronger ECC for data that is stored in the higher order word lines and a weaker ECC for data that is stored in the lower order word lines. In this way, the SSD 202 does not need to use a common strength of ECC that is suited for the worst scenario of BER and can use a flexible ECC selection scheme to increase the reliability of the SSD 202 in one embodiment of the invention.

In another embodiment of the invention, the number of erase operations performed on any physical band or region of the memory modules 0-3 240, 242, 244 and 266 is tracked by the SSD 202. In one embodiment of the invention, the SSD 202 actively matches the ECC strength of any data or code word based on the erase count of the particular memory location where the data or code word is to be stored. For example, in one embodiment of the invention, the SSD 202 uses a stronger ECC strength for data that is to be stored in a memory location that has a higher erase count and uses a weaker ECC strength for data that is to be stored in a memory location that has a lower erase count. One of ordinary skill in the relevant art will readily appreciate that other factors can be used to determine the required strength of the ECC of the data and these other factors can be used without affecting the workings of the invention.

Figure 7:
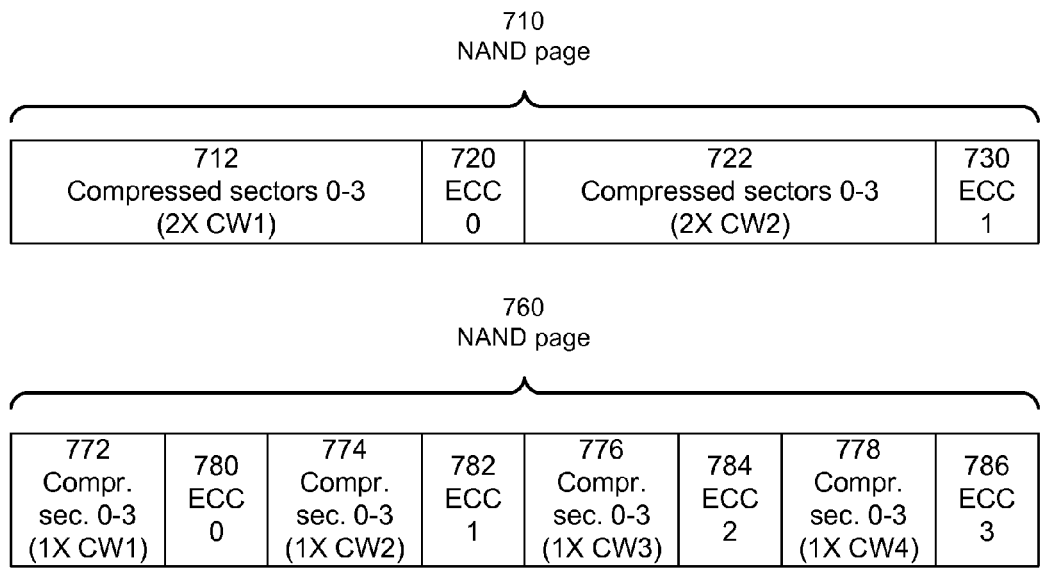
FIG. 7 illustrates a block diagram of two NAND flash memory pages in accordance with one embodiment of the invention.

FIG. 7 illustrates a block diagram 700 of two NAND flash memory pages 710 and 760 in accordance with one embodiment of the invention. For clarity of illustration, FIG. 7 is discussed with reference to FIG. 1B. The NAND flash memory pages 710 and 760 illustrate two different embodiments of the compressed data sectors 0-3 formed by compressing the sectors 0-3 112, 114, 116, and 118 of the prior art NAND flash memory page 160. The NAND flash memory page 710 illustrates that the compressed data sectors 0-3 are partitioned into two code words, i.e., the compressed sectors 0-3 (code word 1) 712 and the compressed sectors 0-3 (code word 2) 722.

The code word 1 712 and code word 2 722 have an ECC 0 check bytes 720 and ECC 1 check bytes 730 respectively in one embodiment of the invention. Compared to the prior art NAND flash memory page 160, the NAND flash memory page 710 has a stronger ECC strength in one embodiment of the invention. This is because the ECC check bytes 170 of the prior art NAND flash memory page 160 is protecting the uncompressed sectors 0 to 3, 162, 164, 166, and 170 that have a larger number of bits. Each of the ECC 0 check bytes 720 and the ECC 1 check bytes 730 of the NAND flash memory page 710 are protecting a code word of the compressed data sectors 0-3 that have a smaller number of bits.

The NAND flash memory page 760 illustrates that the compressed data sectors 0-3 are partitioned into four code words, i.e., the compressed sectors 0-3 (code word 1) 772, the compressed sectors 0-3 (code word 2) 774, the compressed sectors 0-3 (code word 3) 776 and the compressed sectors 0-3 (code word 4) 778. The code words 1-4 772, 774, 776 and 778 have an ECC 0-3 check bytes 780, 782, 784, and 786 respectively in one embodiment of the invention. Compared to the prior art NAND flash memory page 160, the NAND flash memory page 760 has a stronger ECC strength in one embodiment of the invention as each of the ECC 0-3 check bytes 780, 782, 784, and 786 are protecting a smaller data chunk.

The NAND flash memory pages 710 and 760 illustrate how the SSD 202 dynamically adjusts or selects the strength of the error correcting code (ECC) of the data that is stored in the memory modules 0-3 240, 242, 244, and 246 by adjusting the number of partitions or divisions of the compressed data, i.e., adjusting the number of code words in one embodiment of the invention. For example, in one embodiment of the invention, if a stronger ECC strength is desired, a compression algorithm that can achieve a higher compression ratio can be selected to increase the extra spare area arising from the compression. The extra spare area accommodates a higher number of code words and ECC check bytes which increases the effective ECC strength of the compressed data.

Figure 8:
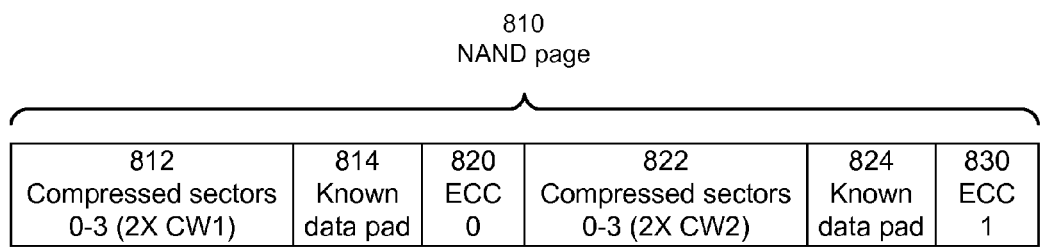
FIG. 8 illustrates a block diagram of a NAND flash memory page in accordance with one embodiment of the invention.

FIG. 8 illustrates a block diagram 800 of a NAND flash memory page 810 in accordance with one embodiment of the invention. For clarity of illustration, FIG. 8 is discussed with reference to FIG. 1B. In one embodiment of the invention, the uncompressed sectors 0 to 3, 162, 164, 166, and 170 of the prior art NAND flash memory page 160 are compressed and partitioned into two code words, i.e., the compressed sectors 0-3 (code word 1) 812 and the compressed sectors 0-3 (code word 2) 822.

In one embodiment of the invention, each of the code words 812 and 822 is appended with the known data pads 814 and 824 respectively. In one embodiment of the invention, the known data pads 814 and 824 have the same known or pre-set data. In other embodiments of the invention, the known data pads 814 and 824 have different known or pre-set data. The ECC of the code words 812 and the known data pad 814 is calculated and the calculated ECC is added as the ECC 0 check bytes 820. Similarly, the ECC of the code words 822 and the known data pad 824 is calculated and the calculated ECC is added as the ECC 1 check bytes 830.

The NAND flash memory page 810 illustrates how the SSD 202 dynamically adjusts or selects the strength of the error correcting code (ECC) of the data that is stored in the memory modules 0-3 240, 242, 244, and 246 by adjusting the number of partitions of the compressed data. The number of sectors and the number of known data pads illustrate in FIG. 8 is not meant to be limiting and other configuration of the number of sectors and known data pads can be used without affecting the workings of the invention.

Figure 1C:
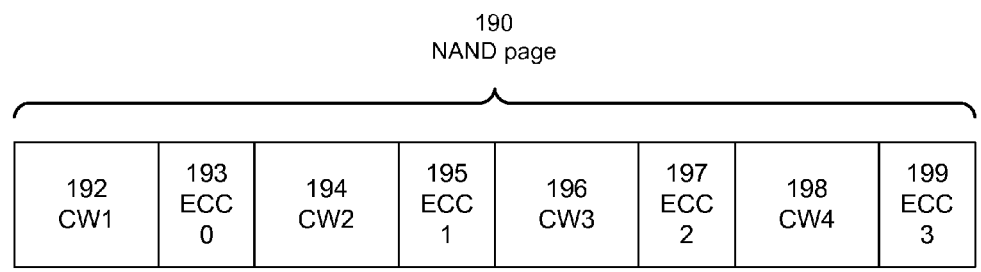
FIG. 1C illustrates a block diagram of code words stored in a prior art NAND flash memory page.
Figure 9:
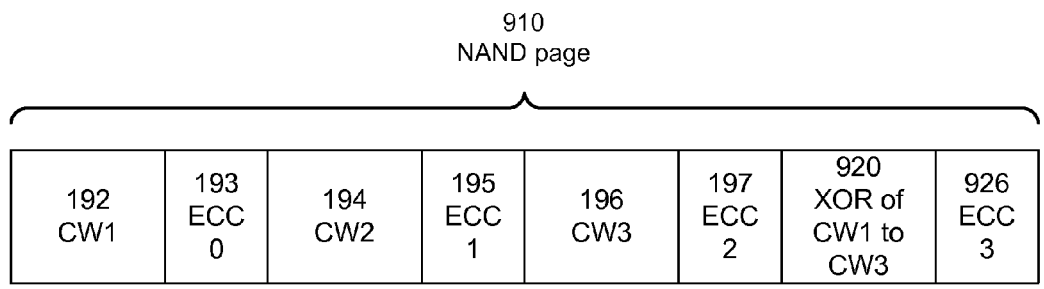
FIG. 9 illustrates a block diagram of a NAND flash memory page in accordance with one embodiment of the invention.

FIG. 9 illustrates a block diagram 910 of a NAND flash memory page 910 in accordance with one embodiment of the invention. For clarity of illustration, FIG. 9 is discussed with reference to FIG. 1C. In one embodiment of the invention, an exclusive OR (XOR) operation is performed on the code word 1 192, the code word 2 194, and the code word 3 196 to obtain a XOR code word 920. The XOR code word is stored in place of the code word 4 198 in the NAND flash memory page 910. The ECC of the XOR code word 920 is calculated and the calculated ECC is added as the ECC 3 check bytes 926.

In one embodiment of the invention, the NAND flash memory page 910 with the XOR protection allows a single read operation of the NAND flash memory page 910 to recover from an uncorrectable ECC error. When the SSD 202 experiences a fatal or unrecoverable error in one of the code words 1-3 192, 194 and 196, the SSD 202 can use the XOR code word 920 to regenerate the code word with the fatal error in one embodiment of the invention. The SSD 202 can recover from the fatal error in the code word by reading the single NAND flash memory page 910, i.e., intra-page XOR protection, in one embodiment of the invention.

The selection of the last code word 4 198 to be replaced by the XOR code word 920 is not meant to be limiting. In other embodiments of the invention, a different code word is selected to be replaced by an XOR code word. For example, in one embodiment of the invention, the code word 2 194 is selected to be replaced by a XOR code word that is obtained from an XOR operation of the code word 1 192, the code word 3 196 and the code word 4 198. In one embodiment of the invention, the XOR protection in the NAND page 910 is performed when the compression of the uncompressed sectors 0 to 3, 162, 164, 166, and 170 of the prior art NAND flash memory page 160 gains an extra spare area that can accommodate the size of one or more code words.

The techniques described herein allow the SSD 202 to increase its performance and the extra spare area obtained through the compression does not incur any associated cost of NAND area. In one embodiment of the invention, the threshold based compression technique simplifies the book keeping functions of the SSD 202 by reducing the granularity needed for tracking the state of any given block.

Figure 10:
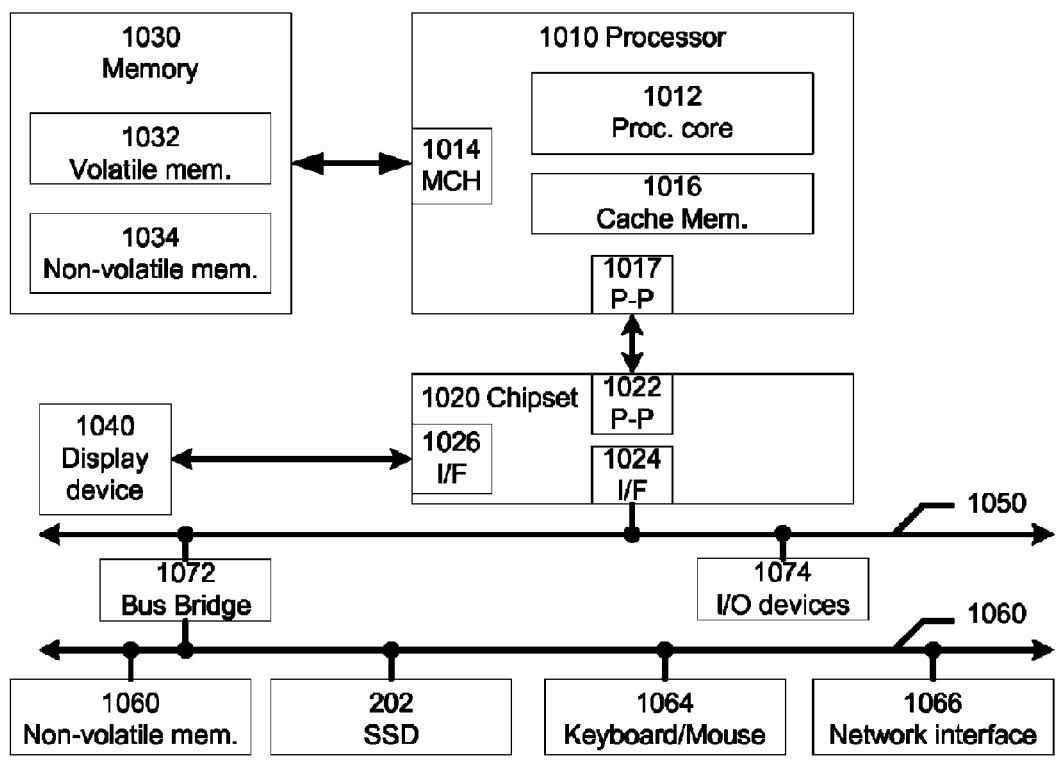
FIG. 10 illustrates a system to implement the methods disclosed herein in accordance with one embodiment of the invention.

FIG. 10 illustrates a system 1000 to implement the methods disclosed herein in accordance with one embodiment of the invention. The system 1000 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 1000 used to implement the methods disclosed herein may be a system on a chip (SOC) system.

The processor 1010 has a processing core 1012 to execute instructions of the system 1000. The processing core 1012 includes, but is not limited to, pre-fetch logic to fetch instructions, decode logic to decode the instructions, execution logic to execute instructions and the like. The processor 1010 has a cache memory 1016 to cache instructions and/or data of the system 1000. In another embodiment of the invention, the cache memory 1016 includes, but is not limited to, level one, level two and level three, cache memory or any other configuration of the cache memory within the processor 1010.

The memory control hub (MCH) 1014 performs functions that enable the processor 1010 to access and communicate with a memory 1030 that includes a volatile memory 1032 and/or a non-volatile memory 1034. The volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1034 includes, but is not limited to, NAND flash memory, phase change memory (PCM), read only memory (ROM), electrically erasable programmable read only memory (EEPROM), or any other type of non-volatile memory device.

The memory 1030 stores information and instructions to be executed by the processor 1010. The memory 1030 may also stores temporary variables or other intermediate information while the processor 1010 is executing instructions. The chipset 1020 connects with the processor 1010 via Point-to-Point (PtP) interfaces 1017 and 1022. The chipset 1020 enables the processor 1010 to connect to other modules in the system 1000. In one embodiment of the invention, the interfaces 1017 and 1022 operate in accordance with a PtP communication protocol such as the Intel® QuickPath Interconnect (QPI) or the like. The chipset 1020 connects to a display device 1040 that includes, but is not limited to, liquid crystal display (LCD), cathode ray tube (CRT) display, or any other form of visual display device.

In addition, the chipset 1020 connects to one or more buses 1050 and 1055 that interconnect the various modules 1074, 1060, 1062, 1064, and 1066. Buses 1050 and 1055 may be interconnected together via a bus bridge 1072 if there is a mismatch in bus speed or communication protocol. The chipset 1020 couples with, but is not limited to, a non-volatile memory 1060, the SSD 202, a keyboard/mouse 1064 and a network interface 1066. The chipset may also include a mass storage device that includes, but is not limited to, a hard disk drive, an universal serial bus flash memory drive, or any other form of computer data storage medium.

The network interface 1066 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the system 1000, the functions performed by some of these blocks may be integrated within a single semiconductor circuit or may be implemented using two or more separate integrated circuits. For example, although the cache memory 1016 is depicted as a separate block within the processor 1010, the cache memory 1016 can be incorporated into the processor core 1012 respectively. The system 1000 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus comprising:
    logic to:
        compress a block of data;
        determine whether the block of data is compressed below a threshold, wherein the threshold is based on at least one of a size of the compressed block of data, and a ratio of a size of the block of data to a size of the compressed block of data; and
        inform data selector logic to send a signal to a component to select the compressed block of data to cause a write of the compressed block of data into one or more memory modules in response to the determination that the block of data is compressed below the threshold.

2. The apparatus of claim 1, wherein the logic is further to write the block of data into one or more memory modules without compression in response to a determination that the block of data is not compressed below the threshold.

3. The apparatus of claim 1, wherein the logic is further to dynamically adjust a strength of an Error Correcting Code (ECC) of the block of data.

4. The apparatus of claim 3, wherein the logic to dynamically adjust the strength of the ECC of the block of data is to dynamically adjust the strength of the ECC of the block of data based on at least one of a Bit Error rate (BER) associated with a location in the one or more memory modules that is to store the block of data and an erase count of a physical region that is to store the block of data.

5. The apparatus of claim 3, wherein the logic to dynamically adjust the strength of the ECC of the block of data is to:
    append a known data pad to the compressed block of data, wherein a combined size of the known data pad and the compressed block of data is to match a size of the block of data;
    determine ECC check bytes of the compressed block of data and the known data pad; and
    append the determined ECC check bytes to the compressed block of data and the known data pad.

6. The apparatus of claim 3, wherein the compressed block of data comprises a plurality of code words and wherein the logic to dynamically adjust the strength of the ECC of the block of data is to:
    determine a respective one of a plurality of ECC check bytes for each of the plurality of code words; and
    append the determined respective one ECC check bytes to each of the plurality of code words.

7. The apparatus of claim 3, wherein the compressed block of data comprises a plurality of code words and wherein the logic to dynamically adjust the strength of the ECC of the block of data is to:
    append a respective one of a plurality of known data pads to each of the plurality of code words;
    determine a respective one of a plurality of ECC check bytes for each of the plurality of code words and each respective one of the plurality of known data pads; and
    append the determined respective one ECC check bytes to each code word and each respective one known data pad.

8. The apparatus of claim 3, wherein the compressed block of data comprises a plurality of code words and wherein the logic to dynamically adjust the strength of the ECC of the block of data is to:
    select one of the plurality of code words;
    perform an exclusive OR (XOR) operation on all the code words except the selected code word to obtain a XOR code word; and
    replace the selected code word with the XOR code word.

9. The apparatus of claim 1, wherein the apparatus is a NAND flash memory solid-state drive (SSD) controller.

10. The apparatus of claim 1, where the apparatus is compliant at least in part with an Open NAND Flash Interface (ONFI) protocol.

11. An apparatus comprising:
    a component receiving raw data;
    data selector logic to inform the component to select input from the received raw data or compressed data;
    compression engine logic to:
        compress the received raw data to produce a compressed block of data;
    send the compressed block of data to the component;
    determine whether the compressed block of data is compressed below a threshold;
    inform the data selector logic to send a signal to the component to select the compressed block of data in response to determining that the compressed block of data is below the threshold, wherein the component selects the compressed block of data to forward the compressed block of data to one or more memory modules in response to receiving the signal to select the compressed block of data.

12. The apparatus of claim 11, wherein the component comprises a multiplexer.

13. The apparatus of claim 11, further comprising:
a memory controller wherein the component forwards the compressed block of data to the memory controller to write to the memory modules.

14. An apparatus, comprising:
logic to:
  receive a block of data from a memory module
  read a token associated with the received block of data to determine whether the received block of data is compressed;
  send a decompression signal to a decompression engine to indicate to decompress the received block of data in response to the token indicating that the received block of data is compressed;
  send a first select signal to a component to output decompressed data from the decompression engine for the received block of data.

15. The apparatus of claim 14, wherein the logic is further to:
  send a second select signal to the component to select to output the received block of data without being decompressed by the decompression engine in response to the token indicating that the received block of data is not compressed.

16. The apparatus of claim 14, wherein the component comprises a multiplexer.

17. The apparatus of claim 14, wherein the component and the decompression engine receive the block of data, wherein the decompression engine does not decompress the received block of data unless the decompression signal is sent to the decompression engine.

* * * * *